(12) United States Patent
Haensgen

(10) Patent No.: US 6,404,180 B1
(45) Date of Patent: Jun. 11, 2002

(54) TECHNIQUE FOR SENSING CURRENT IN A CONDUCTOR WITH REDUCED SUSCEPTIBILITY TO ELECTRICAL NOISE ON THE CONDUCTOR

(75) Inventor: Steven T. Haensgen, Oak Creek, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

(21) Appl. No.: 09/406,514

(22) Filed: Sep. 28, 1999

(51) Int. Cl.[7] .............................................. G01R 1/20
(52) U.S. Cl. .................................. 324/117 H; 324/127
(58) Field of Search ........................ 324/117 H, 117 R, 324/126, 127, 225, 251; 338/32 H; 336/85; 372/38.01

(56) References Cited

U.S. PATENT DOCUMENTS

| 5,041,761 A | * | 8/1991 | Wright et al. ............ 324/117 H |
| 5,530,937 A | * | 6/1996 | Sugiyama ................. 372/38.07 |
| 5,583,429 A | * | 12/1996 | Otaka .......................... 324/127 |
| 6,005,383 A | * | 12/1999 | Savary et al. ........... 324/117 H |

* cited by examiner

Primary Examiner—Vinh P. Nguyen
(74) Attorney, Agent, or Firm—Robert A. VanSomeren; Alexander M. Gerasimow; William R. Walbrun

(57) ABSTRACT

A system and method for measuring current flow through a conductor. The system includes a core having a general ring shape and a central opening. The core terminates at two ends that form a gap for receiving a Hall generator. The core is electrically coupled to a ground to prevent electrical noise on the conductor from being coupled to the Hall generator, thus permitting the direct use of the voltage signal output by the Hall generator.

21 Claims, 2 Drawing Sheets

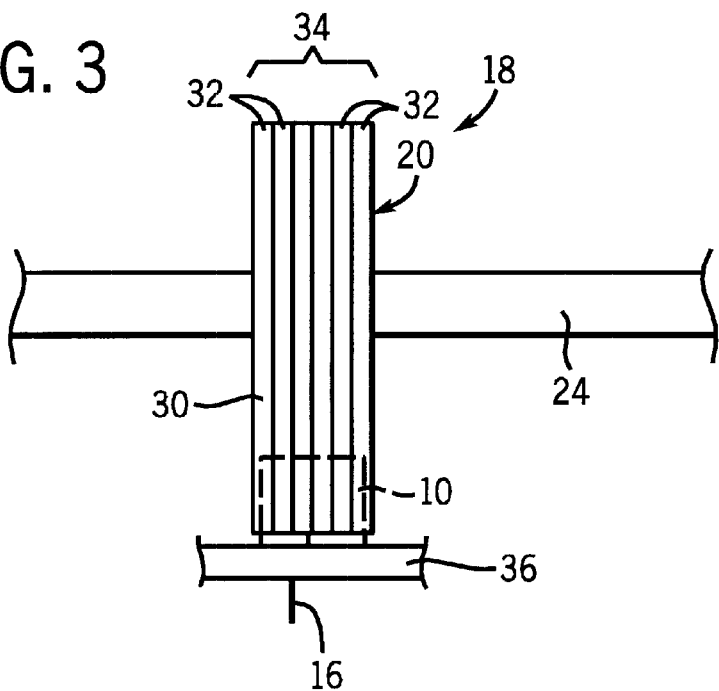
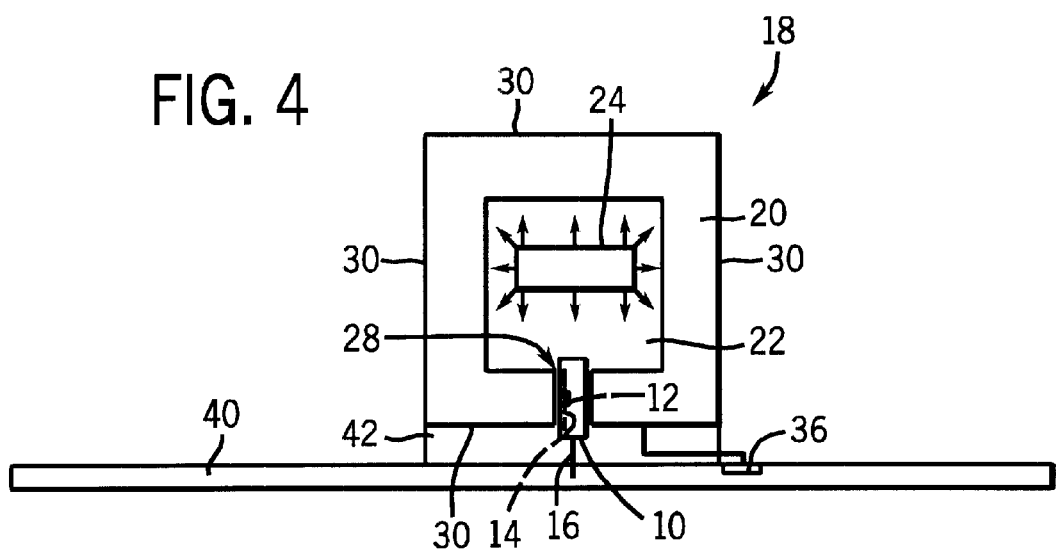

TECHNIQUE FOR SENSING CURRENT IN A CONDUCTOR WITH REDUCED SUSCEPTIBILITY TO ELECTRICAL NOISE ON THE CONDUCTOR

FIELD OF THE INVENTION

The present invention relates generally to sensors for determining a level of current in a conductor, and particularly to a Hall effect current sensor system that is substantially immune to electrical noise.

BACKGROUND OF THE INVENTION

A variety of sensors are used to measure the amount of current flowing through a conductor. One such example is an open loop Hall effect current sensor. An open loop Hall sensor that measures current flowing through a conductor and provides an output signal proportional to the level of current. Such a Hall effect current sensor can include a gapped, ferrous-based core which surrounds the conductor and a Hall generator. The Hall generator is placed within the gap of the core.

Such an open loop configuration is typically susceptible to electrical noise on the conductor. Thus, the accuracy of the Hall generator potentially suffers due to electrical noise on the conductor being indirectly coupled through the core to the Hall generator.

The metallic core typically has a significant amount of surface area in parallel with the conductor, and a measurable amount of electrical noise can be capacitively coupled from the conductor to the floating core. Additionally, when a typical Hall generator is positioned in a core gap, the ends of the core have a significant amount of surface area in parallel with the generator. This allows noise on the core to be capacitively coupled to the generator. If the level of noise coupled indirectly from the conductor to the generator (via the core) is significant, the Hall effect current sensor provides an output signal that inaccurately represents the level of current in the conductor.

It would be advantageous to utilize an open-loop system in which the Hall generator is substantially immune from direct or indirect electrical noise.

SUMMARY OF THE INVENTION

The present invention features a system for measuring current flowing through a conductor. The system includes a core having a general ring-shape. The gap within the gapped core is defined by a pair of parallel faces. The core contains a central opening for receiving a conductor therethrough. The system further includes a Hall generator disposed in the gap and a ground. The core is electrically connected to the ground.

According to another aspect of the invention, a system is provided for detecting a current level in a conductor. The system includes a metallic core having an opening therethrough. The metallic core further includes a gap extending from the opening to an outer surface of the core. The system also includes at least one conductor extending through the opening, and a sensor disposed in the gap. The sensor cooperates with the core in detecting a current in at least one conductor and outputs a voltage proportional to the current. The system further includes a ground and an electrical connection between the core and the ground.

According to another aspect of the present invention, a method is provided for detecting a current level or change in current level in a conductor. The method includes locating a core about a conductor such that the core does not physically contact the conductor. The method further includes placing a gap in the core, and inserting a Hall generator in the gap. The Hall generator is arranged such that it cooperates with the core to output a signal proportional to the current in the conductor. The method further includes electrically grounding the core to provide immunity from electrical noise.

BRIEF DESCRIPTION OF THE DRAWINGS

The invention will hereafter be described with reference to the accompanying drawings, wherein like reference numerals denote like elements, and:

FIG. 3 is a side view of the system illustrated in FIG. 2; and

FIG. 4 illustrates an alternate embodiment of the system illustrated in FIG. 2.

DETAILED DESCRIPTION OF THE PREFERRED EMBODIMENTS

Figure 1:
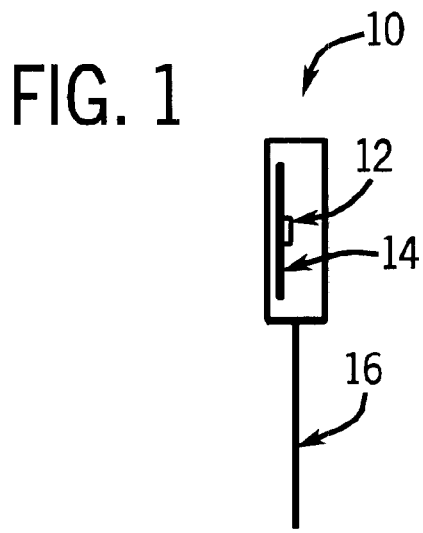
FIG. 1 is a side view of an exemplary Hall generator utilized in a preferred embodiment of the present invention.

Referring generally to FIG. 1, an exemplary Hall generator 10 is illustrated. Hall generator 10 represents a typical embodiment of Hall generator for use in the present invention. Hall generator 10 includes a Hall plate 12 that cooperates with the a Hall substrate 14. Additionally, Hall generator 10 includes leads 16 designed to carry an output signal in the form of an output voltage that is proportional to the magnetic flux acting on Hall generator 10, which is proportional to the current passing through the conductor.

Figure 2:
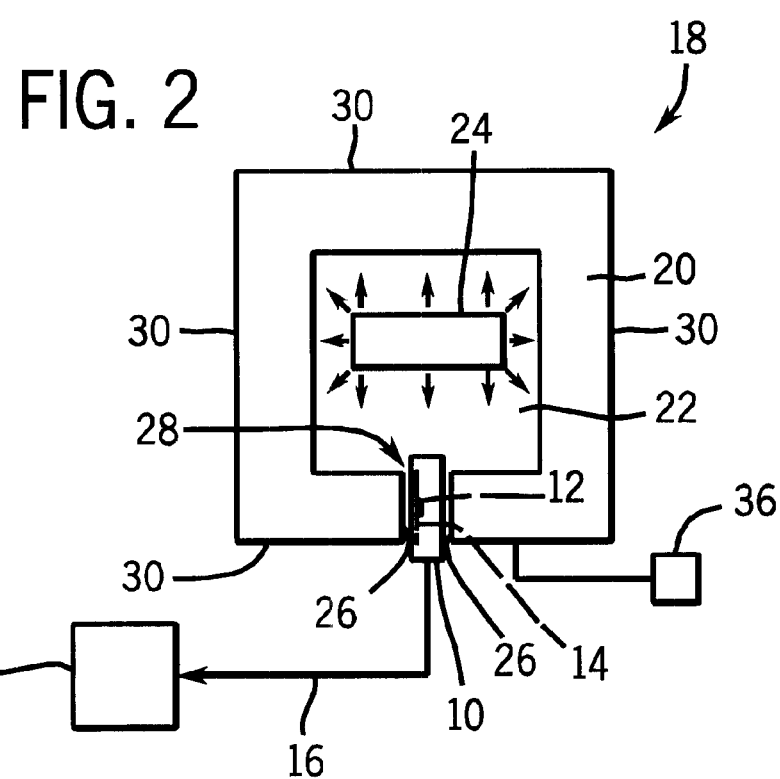
FIG. 2 is a front view of a sensor system according to a preferred embodiment of the present invention.

Hall generator 10 is utilized in a Hall effect current sensor system 18, as illustrated in FIG. 2. Sensor system 18 includes a core 20 that is typically formed from a ferrous-based material. Core 20 includes a central opening 22 through which a conductor 24 extends. Core 20 is generally ring-shaped and includes a pair of core faces 26 that are generally parallel to each other across a gap 28. Ring-shaped includes a variety of shapes including rectangular, U-shaped, and circular. Gap 28 preferably is sized to receive Hall generator 10, and most preferably is sized such that core faces 26 lie proximate to the Hall generator 10 without contacting Hall generator 10. As current passes through conductor 24, a magnetic flux proportional to the current is established in core 20 and sensed by Hall generator 10.

In the illustrated embodiment, core 20 is formed as a ring that has a generally rectangular shape, e.g. square, having four sides 30. In this embodiment, central opening 22 also is substantially rectangular, e.g. square, and conductor 24 is rectangular, as illustrated. Also, core 20 preferably is formed from a plurality of laminations 32 to form a lamination stack 34, as illustrated in FIG. 3.

The arrangement of components in the Hall effect current sensor system 18 is selected to minimize electrical noise that can effect the signal output by Hall generator 10. For example, core 20 is electrically connected to-a ground 36. Ground 36 can either be a circuit ground or a protective "earth" ground. This grounding of core 20 has no detrimental effects with respect to the magnetic properties or characteristics of the metallic core 20. However, the grounding substantially reduces or eliminates the effects of electrical noise that can be capacitively coupled from conductor 24 to a floating core, such as core 20. Absent the grounding to ground 36, this electrical noise can be capacitively coupled to Hall generator 10 due to the significant amount of surface area that core ends 26 have in parallel with generator 10. Additionally, Hall generator 10 is made relatively immune to direct electrical noise on conductor 24 by positioning Hall plate 12 and Hall substrate 14 in a generally perpendicular orientation with respect to the electrical fields radiated from conductor 24. (See FIG. 2).

Thus, Hall generator 10 is substantially immune from both direct electrical noise on conductor 24 and electrical noise that otherwise would be capacitively coupled from conductor 24 to core 20 and from core 20 to Hall generator 10. Electrically connected core 20 to ground 36 effectively shunts the electrical noise away from Hall generator 10. Consequently, sensor system 18 may be designed as an open loop system, illustrated in FIG. 2, because the voltage signal output through leads 16 remains stable and representative of the current passing through conductor 24. This voltage signal can be used directly by a recipient device 38. An exemplary recipient device 38 is any device or application for which or in which there is a need to sense or measure current.

An exemplary utilization of Hall effect current sensor system 18 is illustrated in FIG. 4. In this particular implementation, core 20 is mounted to a circuit board 40 by an appropriate mounting structure 42. Mounting structure 42 preferably holds core 20 generally perpendicular to the circuit board 40, such that conductor 24 is generally parallel with the circuit board as it extends through central opening 22. Also, the Hall generator 10 preferably is generally perpendicular to circuit board 40 to help isolate it from electrical noise that results from other components or circuits on board 40.

Circuit board 40 may be designed in a variety of configurations for mounting in numerous devices, such as relays, that require accurate sensing of current level through one or more conductors. In this embodiment, ground 36 typically comprises a circuit ground disposed in or on circuit board 40. The embodiment illustrated in FIG. 4 shows one of many potential uses and implementations of the unique Hall effect current sensor system 18.

It will be understood that the foregoing description is of a preferred exemplary embodiment of this invention and that the invention is not limited to the specific forms shown. For example, the core may have a variety of configurations and sizes; the Hall generator preferably is centered with respect to the core ends and oriented perpendicular to conductor 24, but those parameters may be altered; the materials utilized in forming the conductor and core may be varied depending on the specific application; and there may be several different types of recipient devices. These and other modifications may be made in the design and arrangement of the elements described above without departing from the scope of the invention as expressed in the appended claims.

What is claimed is:

1. A system for measuring current flowing through a conductor, comprising:
    a core having a general ring shape and a pair of core faces separated by a gap, the core defining a central opening for receiving a conductor therethrough;
    a Hall generator disposed in the gap; and
    a ground, wherein the core is directly electrically connected to the ground.

2. The system as recited in claim 1, wherein the core comprises a lamination stack.

3. The system as recited in claim 1, wherein the core is generally rectangular and includes four sides.

4. The system as recited in claim 3, wherein the gap is disposed at approximately a midpoint of one of the four sides.

5. The system as recited in claim 4, wherein the central opening is generally rectangular.

6. The system as recited in claim 1, further comprising a printed circuit board to which the Hall generator is electrically connected.

7. The system as recited in claim 6, wherein the core is disposed generally perpendicular to the printed circuit board such that the central opening extends through the core generally parallel with the printed circuit board.

8. The system as recited in claim 7, wherein the ground is disposed on the printed circuit board.

9. A system for detecting a current level in a conductor, comprising:
    a metallic core having an opening therethrough and a gap extending from the opening to an outer surface of the metallic core;
    at least one conductor extending through the opening without contacting the metallic core;
    a sensor disposed in the gap to cooperate with the core in detecting a current in the at least one conductor, the sensor outputting a signal proportional to the current; and p1 a ground, the core being electrically connected to the ground.

10. The system as recited in claim 9, wherein the metallic core comprises a lamination stack.

11. The system as recited in claim 10, wherein the sensor comprises a Hall generator.

12. The system as recited in claim 11, wherein the Hall generator is arranged generally perpendicular to the at least one conductor.

13. The system as recited in claim 12, wherein the core is generally rectangular.

14. The system as recited in claim 13, wherein the at least one conductor is generally rectangular in cross section.

15. The system as recited in claim 9, wherein the ground is an electrical circuit ground.

16. The system as recited in claim 9, wherein the ground is a protective earth ground.

17. A method for detecting a current level or change in current level in a conductor, comprising:
    locating a core about a conductor such that the core does not physically contact the conductor;
    placing a gap in the core;
    inserting a Hall generator in the gap such that the Hall generator cooperates with the core to output a signal proportional to the current in the conductor; and
    electrically grounding the core to a printed circuit board.

18. The method as recited in claim 17, further comprising forming the core as a lamination stack.

19. The method as recited in claim 17, wherein grounding comprises connecting the core to a circuit ground.

20. The method as recited in claim 17, wherein grounding comprises connecting the core to an earth ground.

21. The method as recited in claim 17, further comprising orienting the Hall generator such that a Hall plate within the Hall generator is generally perpendicular to the conductor.

* * * * *